United States Patent
Cousinard et al.

(10) Patent No.: US 8,600,324 B1
(45) Date of Patent: Dec. 3, 2013

(54) CIRCUIT AND METHOD FOR ADJUSTING A DIGITALLY CONTROLLED OSCILLATOR

(75) Inventors: David Cousinard, Morges (CH); Cao-Thong Tu, Préverenges (CH); Miljan Vuletic, Lausanne (CH); Lydi Smaini, Lausanne (CH)

(73) Assignee: Marvell International Ltd, Hamilton (BM)

(*) Notice: Subject to any disclaimer, the term of this patent is extended or adjusted under 35 U.S.C. 154(b) by 762 days.

(21) Appl. No.: 12/487,425

(22) Filed: Jun. 18, 2009

Related U.S. Application Data

(60) Provisional application No. 61/076,461, filed on Jun. 27, 2008.

(51) Int. Cl.
| | |
|---|---|
| H03J 7/32 | (2006.01) |
| H04B 1/18 | (2006.01) |
| H04B 1/06 | (2006.01) |
| H04B 7/00 | (2006.01) |
| H04B 1/26 | (2006.01) |

(52) U.S. Cl.
USPC ......... 455/192.1; 455/147; 455/255; 455/323

(58) Field of Classification Search
USPC ............... 455/77, 550.1, 131, 139, 147, 148, 455/151.3, 182.2, 190.1, 192.1, 192.2, 255, 455/258, 259, 318, 323
See application file for complete search history.

(56) References Cited

U.S. PATENT DOCUMENTS

| | | | |
|---|---|---|---|
| 5,347,234 A * | 9/1994 | Gersbach et al. | ............... 331/57 |
| 5,634,207 A | 5/1997 | Yamaji et al. | |
| 5,847,616 A | 12/1998 | Ng et al. | |
| 5,995,819 A | 11/1999 | Yamaji et al. | |
| 6,167,245 A | 12/2000 | Welland et al. | |
| 6,285,262 B1 | 9/2001 | Kuriyama | |
| 6,438,364 B1 | 8/2002 | Waite | |
| 6,452,458 B1 | 9/2002 | Tanimoto | |
| 6,509,777 B2 | 1/2003 | Razavi et al. | |
| 6,535,037 B2 | 3/2003 | Maligeorgos | |
| 6,650,195 B1 | 11/2003 | Brunn et al. | |
| 6,741,846 B1 | 5/2004 | Welland et al. | |
| 6,816,718 B2 | 11/2004 | Yan et al. | |
| 7,139,540 B2 | 11/2006 | Wu et al. | |
| 7,212,798 B1 | 5/2007 | Adams et al. | |
| 7,286,009 B2 * | 10/2007 | Andersen et al. | ............... 330/10 |
| 7,298,183 B2 | 11/2007 | Mirzaei et al. | |

(Continued)

OTHER PUBLICATIONS

"Non-Final Office Action", U.S. Appl. No. 12/358,955, Aug. 20, 2012, 33 pages.

(Continued)

*Primary Examiner* — Andrew Wendell

(57) ABSTRACT

In one embodiment the present invention includes a method of generating an oscillating signal at different frequencies. The method comprises configuring a digitally controlled oscillator (DCO). The DCO is configured to generate the oscillating signal at a first frequency, and the DCO is configured to generate the oscillating signal at a second frequency. Additionally, the DCO is configured to transition from the first frequency to the second frequency during a transition time period. During the transition time period, the DCO activates the second frequency and deactivates the first frequency during a plurality of time intervals. The time intervals for activating the second frequency and deactivating the first frequency successively increase from the beginning of the transition time period to the end of the transition time period.

20 Claims, 8 Drawing Sheets

(56) References Cited

U.S. PATENT DOCUMENTS

| | | | |
|---|---|---|---|
| 7,310,023 B2 | 12/2007 | Cha et al. | |
| 7,319,849 B2 | 1/2008 | Womac | |
| 7,395,040 B2 | 7/2008 | Behzad | |
| 7,616,935 B2 * | 11/2009 | Fernandez-Corbaton et al. | 455/255 |
| 7,656,205 B2 | 2/2010 | Chen et al. | |
| 7,672,645 B2 | 3/2010 | Kilpatrick et al. | |
| 7,689,190 B2 * | 3/2010 | Kerth et al. | 455/255 |
| 8,077,652 B2 * | 12/2011 | Thesling | 370/316 |
| 8,081,038 B2 | 12/2011 | Lee et al. | |
| 8,139,670 B1 | 3/2012 | Son et al. | |
| 2003/0148750 A1 | 8/2003 | Yan et al. | |
| 2004/0198297 A1 | 10/2004 | Oh et al. | |
| 2005/0064840 A1 | 3/2005 | Heydari et al. | |
| 2005/0090218 A1 | 4/2005 | Ishida et al. | |
| 2006/0049880 A1 | 3/2006 | Rein et al. | |
| 2006/0114044 A1 | 6/2006 | Mintchev et al. | |
| 2006/0128347 A1 * | 6/2006 | Piriyapoksombut et al. | 455/333 |
| 2006/0223474 A1 | 10/2006 | Yoshizaki et al. | |
| 2007/0077908 A1 | 4/2007 | Vorenkamp et al. | |
| 2007/0142080 A1 | 6/2007 | Tanaka et al. | |
| 2007/0173286 A1 | 7/2007 | Carter et al. | |
| 2007/0200622 A1 | 8/2007 | Filoramo et al. | |
| 2007/0202814 A1 | 8/2007 | Ono et al. | |
| 2007/0264959 A1 | 11/2007 | Carrez | |
| 2008/0045162 A1 | 2/2008 | Rofougaran et al. | |
| 2008/0111639 A1 * | 5/2008 | Ryckaert et al. | 331/57 |
| 2008/0261552 A1 | 10/2008 | Chung | |
| 2008/0272818 A1 | 11/2008 | Ko | |
| 2009/0143043 A1 | 6/2009 | Yoshizaki et al. | |
| 2009/0280762 A1 | 11/2009 | Park et al. | |
| 2009/0312056 A1 * | 12/2009 | Drugge et al. | 455/561 |
| 2010/0052796 A1 * | 3/2010 | Menkhoff | 331/17 |
| 2010/0080319 A1 * | 4/2010 | Blocher et al. | 375/295 |
| 2010/0283654 A1 * | 11/2010 | Waheed et al. | 341/166 |
| 2011/0053522 A1 | 3/2011 | Rofougaran et al. | |
| 2012/0025921 A1 | 2/2012 | Yang et al. | |
| 2013/0057344 A1 | 3/2013 | Touzard et al. | |

OTHER PUBLICATIONS

"Final Office Action", U.S. Appl. No. 12/358,955, Mar. 18, 2013, 12 pages.

"Final Office Action", U.S. Appl. No. 12/358,955, (Feb. 17, 2012), 26 pages.

"Non-Final Office Action", U.S. Appl. No. 12/235,333, (Jun. 28, 2011), 16 pages.

"Non-Final Office Action", U.S. Appl. No. 12/358,955, (Sep. 6, 2011), 24 pages.

"Notice of Allowance", U.S. Appl. No. 12/235,333, (Nov. 15, 2011), 5 pages.

Mazzanti, et al., "Analysis and Design of Injection-Locked LC Dividers Quadrature Generation", *IEEE Journal of Solid-State Circuits*, vol. 39, No. 9, (Sep. 2004), pp. 1425-1433.

"Notice of Allowance", U.S. Appl. No. 12/358,955, Jul. 1, 2013, 8 pages.

* cited by examiner

CIRCUIT AND METHOD FOR ADJUSTING A DIGITALLY CONTROLLED OSCILLATOR

CROSS REFERENCE TO RELATED APPLICATIONS

This application claims the benefit of U.S. Provisional Application No. 61/076,461, filed Jun. 27, 2008, the disclosure of which is incorporated herein by reference.

BACKGROUND

The present invention relates to digital circuits, and in particular, to a circuit and method for adjusting a digitally controlled oscillator.

FIG. 1 illustrates a communication system 100 that uses digitally controlled oscillator (DCO) 101 to provide a carrier signal for a receiver mixer 103 and a transmitter mixer 104. An input radio frequency (RF) signal RFin is amplified by amplifier 105, demodulated by receiver mixer 103, and processed by inter-frequency (IF)/baseband processor 102. IF/baseband processor 102 also provides a signal that transmitter mixer 104 modulates, and amplifier 106 amplifies to produce RF signal RFout.

DCO 101 receives a control signal of N-bits and may provide a carrier signal having a frequency $f_1$ to receiver mixer 103 and to transmitter mixer 104. DCO 101 uses the digital control signal (N-bits) to adjust the frequency $f_1$.

When the frequency $f_1$ drifts or may otherwise require adjustment, the DCO 101 may be adjusted to provide a carrier signal having a new frequency and/or frequency adjustment. DCO control bits adjust the frequency of the DCO 101 in discrete steps and a minimum step of frequency may represent the smallest change of frequency $f_1$.

The minimum step may be limited by the minimum capacitor values which may be switched internal to DCO 101. The minimum step may cause a disruption, such as glitches, in the processing of the signal within IF/baseband processor 102 or in a subsequent stage. For example, in FM (frequency modulation) demodulation of an audio signal, these glitches may cause clicking sounds from a speaker.

FIG. 2 illustrates the effect of a frequency change 202 on an audio signal 204. FM demodulator 201 receives a FM signal which includes a frequency change 202 over a step 203. This frequency step 203 may create an audio DC step after demodulation, which causes a glitch 205 in the audio signal 204. Glitch 205 may cause audible clicks to the user. If the frequency is recalibrated periodically, it may create undesirable audible tones.

SUMMARY

Embodiments of the present invention improve digital frequency adjustment. In one embodiment, the present invention includes a method of generating an oscillating signal at different frequencies, the method comprising configuring a digitally controlled oscillator to generate the oscillating signal at a first frequency, and configuring the digitally controlled oscillator to transition from the first frequency to a second frequency during a transition time period, the second frequency being different than the first frequency. During the transition time period, the digitally controlled oscillator activates the second frequency and deactivates the first frequency during a plurality of time intervals. The time intervals for activating the second frequency and deactivating the first frequency successively increase from a beginning of the transition time period to an end of the transition time period.

In one embodiment, the time intervals are increased based on a linear ramp.

In one embodiment, the time intervals are generated in response to a pulse width modulated signal.

In one embodiment, the method further comprises generating a transition signal and converting the transition signal into a bit stream to configure the digitally controlled oscillator to activate and deactivate the first frequency and the second frequency.

In one embodiment, the transition signal is a digital signal that successively increases from a first value to a second value.

In one embodiment, converting the transition signal into a bit stream comprises processing the digital signal in a sigma-delta modulator.

In one embodiment, configuring the digitally controlled oscillator to transition includes generating a bit stream, wherein the bit stream comprises pulse width modulated data corresponding to a transition signal, and wherein a selection between a first code corresponding to the first frequency and a second code corresponding to the second frequency is responsive to the bit stream.

In one embodiment, the present invention includes an electronic circuit comprising a digital controlled oscillator for generating an oscillating signal and a transition controller coupled to the digitally controlled oscillator. The transition controller configures the digitally controlled oscillator to generate the oscillating signal at a first frequency and transitions the oscillating signal from the first frequency to a second frequency during a transition time period, where the second frequency is different than the first frequency. During the transition time period, the digitally controlled oscillator activates the second frequency and deactivates the first frequency during a plurality of time intervals, where the time intervals for activating the second frequency and deactivating the first frequency successively increase from a beginning of the transition time period to an end of the transition time period.

In one embodiment, the transition controller includes a digital signal generator to provide a linear ramp to increase the time intervals.

In one embodiment, the transition controller includes a modulator to provide a pulse width modulated signal, where the time intervals are generated in response to the pulse width modulated signal.

In one embodiment, the transition controller comprises a digital signal generator to provide a transition signal and a converter to convert the transition signal into a bit stream to configure the digitally controlled oscillator to activate and deactivate the first frequency and the second frequency.

In one embodiment, the converter is a sigma delta modulator to convert the transition signal into a bit stream.

In one embodiment, the transition signal is a digital signal that successively increases from a first value to a second value.

In one embodiment, the transition controller generates a bit stream to configure the digitally controlled oscillator to transition, where the bit stream comprises pulse width modulated data corresponding to a transition signal, and a selection between a first code corresponding to the first frequency and a second code corresponding to the second frequency is responsive to the bit stream.

In one embodiment, the present invention includes a communication system comprising an amplifier to amplify a radio frequency signal, a mixer to demodulate the radio frequency signal, a digital controlled oscillator to provide an oscillating signal to the mixer, and a transition controller coupled to the digitally controlled oscillator. The transition controller configures the digitally controlled oscillator to generate the oscillating signal at a first frequency and transitions the oscillating signal from the first frequency to the second frequency during a transition time period, the second frequency being different than the first frequency, wherein during the transition time period, the digitally controlled oscillator activates the second frequency and deactivates the first frequency during a plurality of time intervals, and wherein the time intervals for activating the second frequency and deactivating the first frequency successively increase from a beginning of the transition time period to an end of the transition time period.

The following detailed description and accompanying drawings provide a detailed description of the present invention.

DETAILED DESCRIPTION

Described herein are techniques for adjusting a digitally controlled oscillator. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 3A:
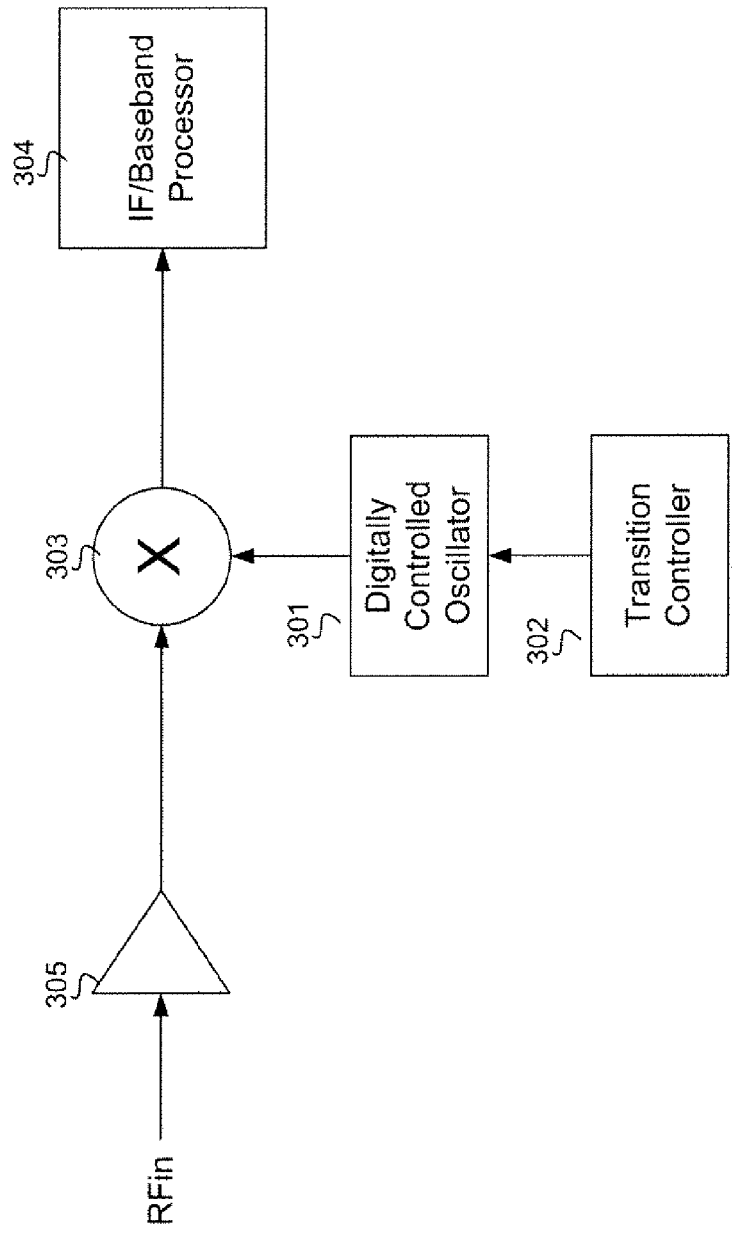
FIG. 3A illustrates a RF communication system.

FIG. 3A illustrates a RF communication system 300. RF communication system 300 includes amplifier 305, mixer 303, IF/baseband processor 304, digitally controlled oscillator (DCO) 301, and transition controller 302. Amplifier 305 receives and amplifies signal RFin (e.g., from an antenna). Mixer 303 demodulates RFin by using an oscillating signal from digitally controlled oscillator 301. The demodulated signal from mixer 303 is received and processed by IF/baseband processor 304. Transition controller 302 generates a digital signal to configure digitally controlled oscillator 301. The digitally controlled oscillator 301 may be configured to generate signals at different frequencies and may be configured to transition from a signal having one frequency to a signal having another frequency.

Figure 3B:
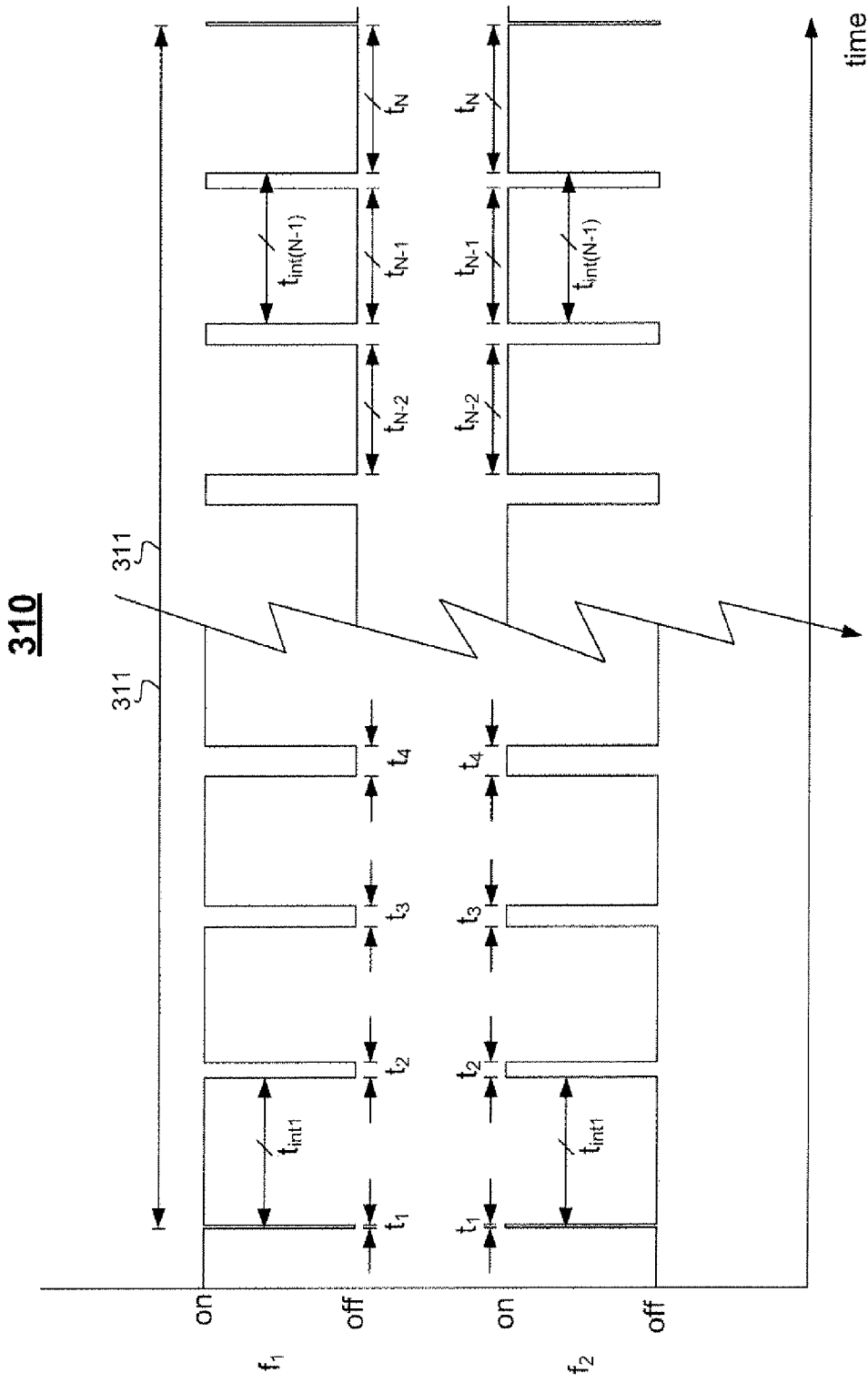
FIG. 3B illustrates a timing diagram 310 associated with the communication system of FIG. 3A.

FIG. 3B illustrates an example timing diagram 310 associated with the communication system 300 of FIG. 3A. Timing diagram 300 includes waveform $f_1$ showing the activation/deactivation of a first frequency, and waveform $f_2$ showing the activation/deactivation of a second frequency. Before transition period 311, DCO 301 of FIG. 3A may be configured to generate the oscillating signal at a first frequency. After transition period 311, DCO 301 may be configured to generate the oscillating signal at a second frequency.

As shown in the timing diagram 310, the first frequency is deactivated and the second frequency is activated for time intervals $t_1, t_2, t_3, \ldots, t_{N-2}, t_{N-1}, t_N$. The time intervals successively increase from the beginning of transition period 311 to the end of the transition period 311. For example, during time interval $t_1$, the transition controller may deactivate the first frequency (i.e., the frequency of the signal before the transition) and activate the second frequency (i.e., the frequency of the signal after the transition). Initially, the time interval when the first frequency is deactivated and the second frequency is activated is small. Accordingly, the average frequency is approximately the first frequency. However, as the transition period 311 progresses, the time intervals increase. Accordingly, toward the end of the transition period 311, the time interval when the first frequency is deactivated and the second frequency is activated is large. Accordingly, the average frequency is approximately the second frequency. Features and advantages of the present invention include transitioning from one frequency to another by successively increasing the time intervals as described above, thereby resulting in a smoother frequency transition than would be obtained with a step increase between the two frequencies. The intervals may increase according to a variety of techniques. In one embodiment, the intervals may be increased based on a transition signal such as a linear ramp, for example. As described below, different transition signals may be used. In one embodiment, the time period from the beginning one time interval to the beginning of the next time interval may be constant across the entire transition period, as in some pulse code modulated systems (e.g., $t_{int1}$ may be the same as time period $t_{int(N-1)}$). Therefore, the time intervals (e.g. t1, t2, etc. . . . ) may correspond to transition signal which has been pulse width modulated as described in more detail below.

Figure 1:
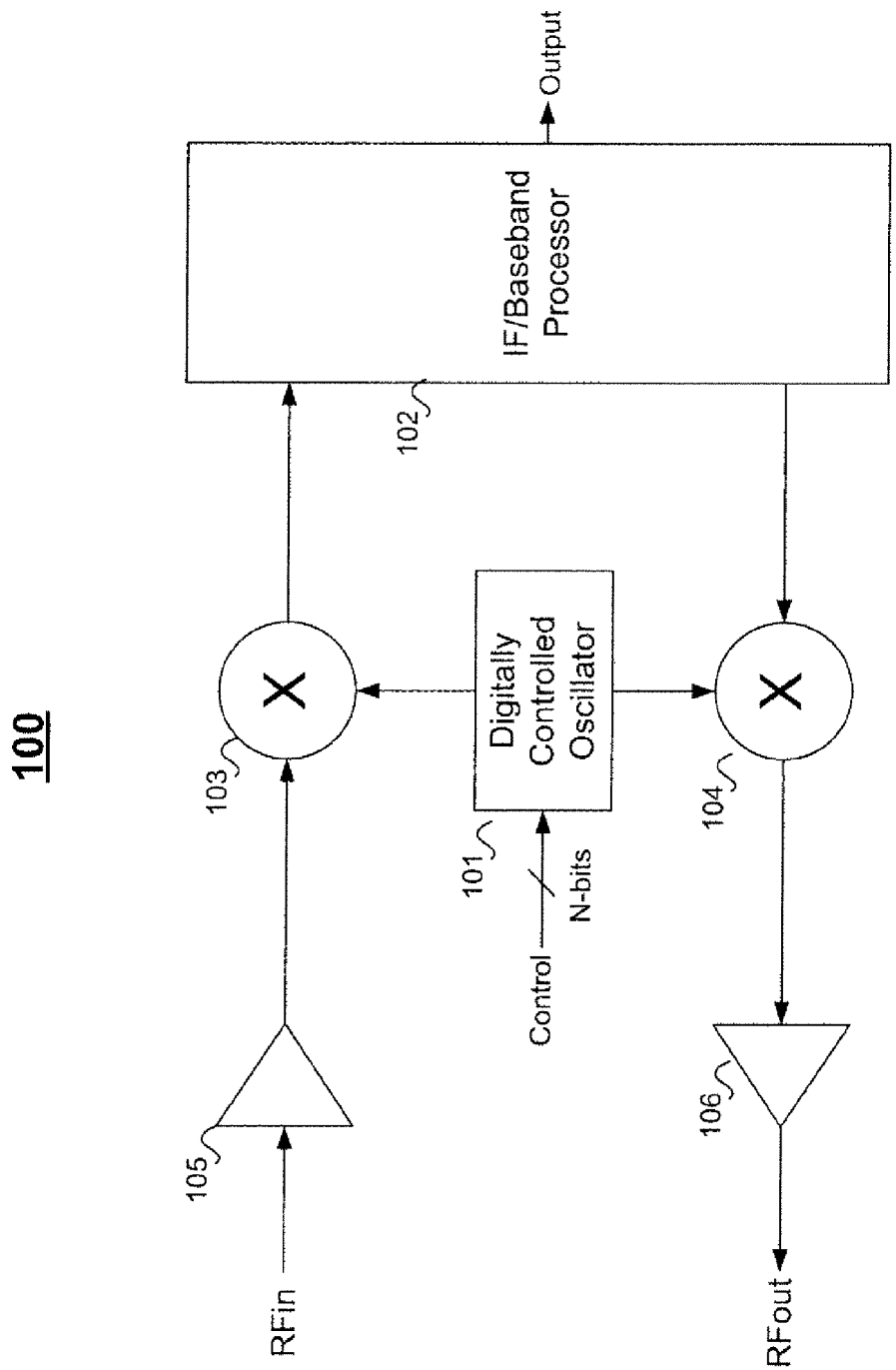
FIG. 1 illustrates a conventional communication system that uses a digitally controlled oscillator to provide a carrier signal for a receiver mixer and a transmitter mixer.
Figure 2:
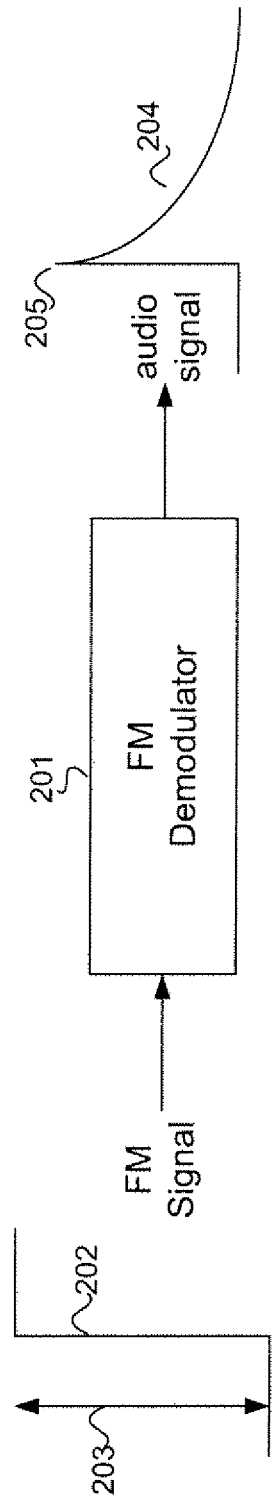
FIG. 2 illustrates the effect of a frequency change on an audio signal.
Figure 3C:
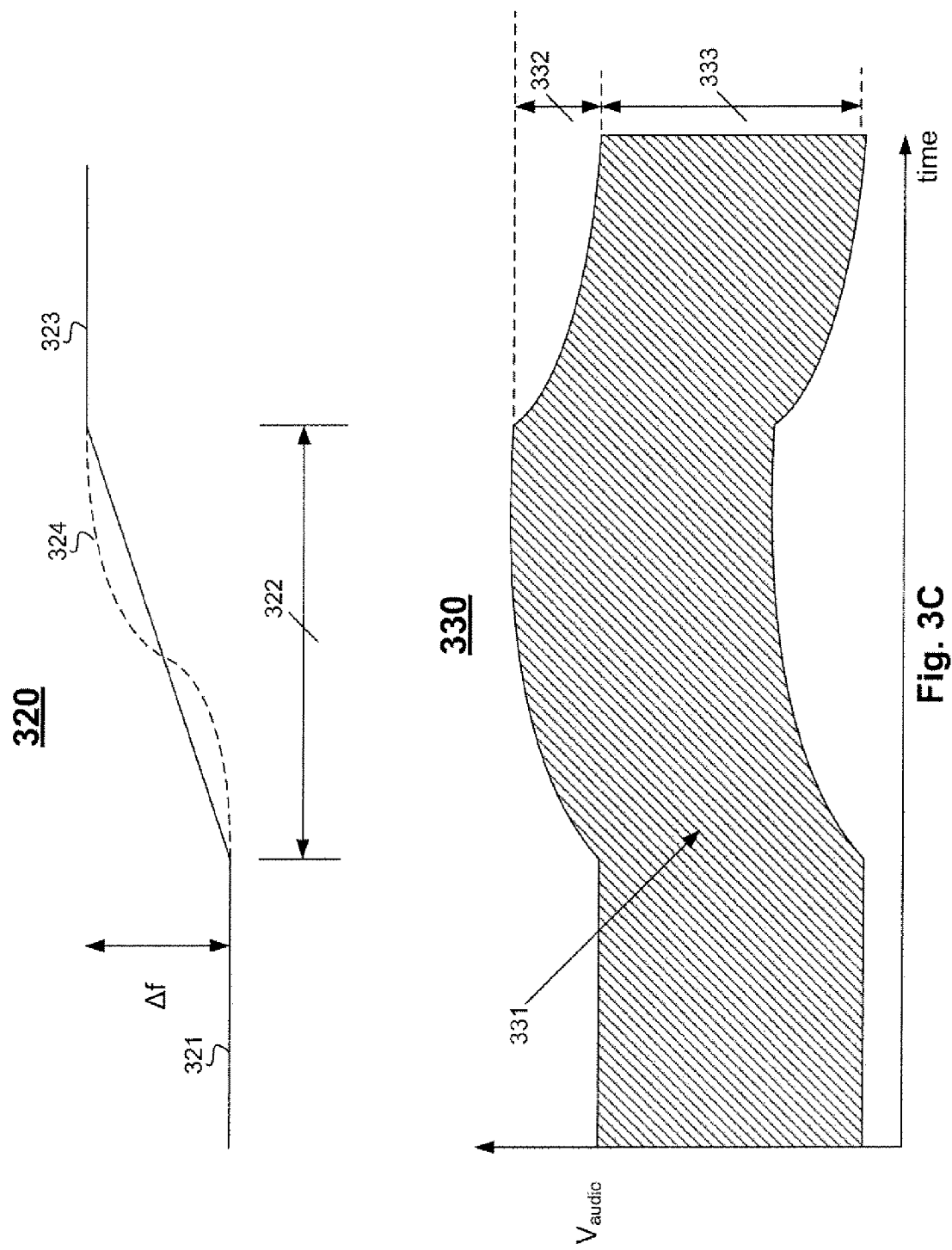
FIG. 3C illustrates a transition signal waveform and a corresponding audio signal waveform associated with the communication system of FIG. 3A.

FIG. 3C illustrates an example transition signal waveform 320 and a corresponding audio signal waveform 330 associated with the communication system of FIG. 3A. In the example of FIG. 3C, transition signal waveform 320 is a linear ramp. Level 321 may correspond to a first frequency and level 323 may correspond to a second frequency. During transition period 322, transition signal waveform 320 increases from level 321 to level 323. Audio signal waveform 330 indicates the effect of a change in frequency on an audio signal envelope 333 after FM demodulation. The deviation of the signal illustrated by 332 is significantly reduced by using the frequency transition techniques described herein as compared with a step frequency change. In comparison with prior art techniques illustrated at 204 and 205 in FIG. 2, the audio signal change is smoother and not as abrupt, which reduces audible noise resulting from the transition. While the above transition signal illustrates an increasing transitional waveform, it is to be understood that other embodiments of the present invention may use a transition scheme using successively decreasing time intervals and decreasing transition signals. The examples provided in this specification for increasing time intervals and increasing transitions signals are, therefore, only exemplary.

Portion 331 indicates approximately where audio signal waveform 330 is perturbed by the transition signal waveform 320, and audio signal waveform 330 moves an additional amount 332. The amount of perturbation of the audio signal waveform 330 may be further reduced by altering the transition signal waveform 320 as indicated by alternative transition signal waveform 324 (shown by dashed line). Alternative transition signal waveform 324 may be associated with a higher order equation such as arctangent, for example. The time intervals of FIG. 3B may be increased successively based on the linear ramp, arctangent, or other monotonically increasing signal used for the transition signal waveform 320.

Figure 4:
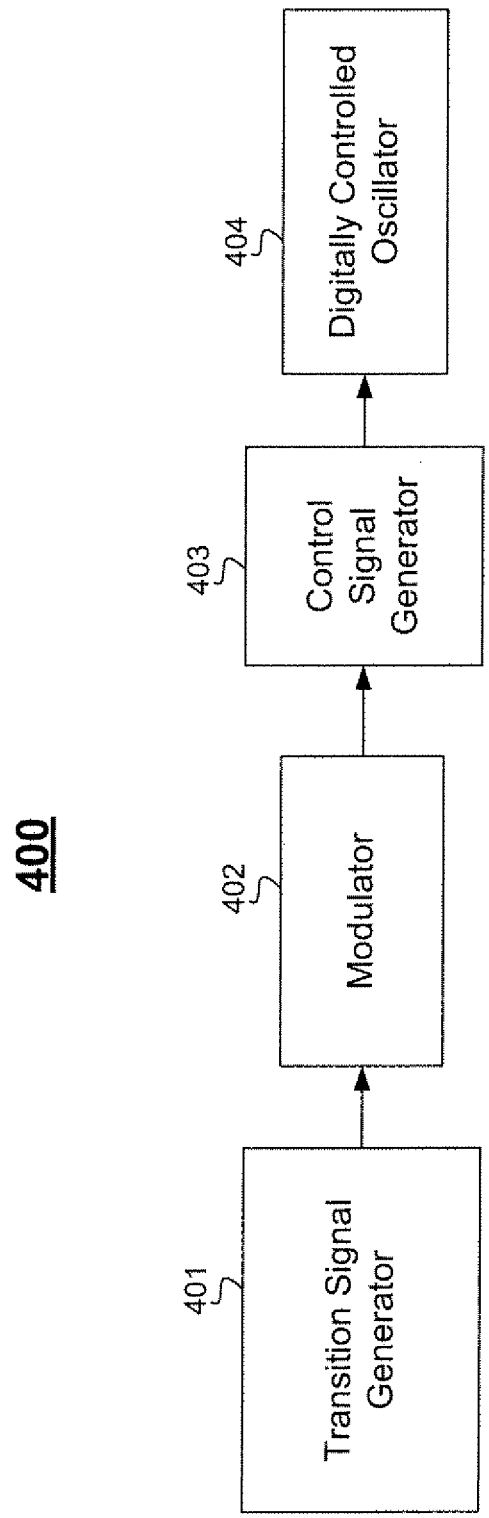
FIG. 4 illustrates an electronic circuit for generating an oscillating signal.

FIG. 4 illustrates an example electronic circuit 400 for generating an oscillating signal. Electronic circuit 400 includes transition signal generator 401, modulator 402, control signal generator 403, and DCO 404. Control signal generator 403 may generate control signals, such as digital control signals, to configure DCO 404 to generate an oscillating signal at a first frequency. Also, control signal generator 403 may generate control signals to configure DCO 404 to generate an oscillating signal at a second frequency. The control signal generator 403 may receive inputs from the transition signal generator 401 and modulator 402 to configure DCO 404 to transition from the first frequency to the second frequency.

Transition signal generator 401 generates transition signals. For example, the transition signal may be a linear ramp, an arctangent, or a combination of mathematical equations that produce a smooth transition from a first level to a second level. The transition signal generator 401 may generate a digital signal corresponding to a continuous transitional waveform. The transition signal may be a digital signal that successively increases from a first initial value to a second final value with a plurality of intermediate values. In this case, the first value may correspond to a first frequency and the second value may correspond to a second frequency. In one embodiment, the transition signal generator 401 is a counter, for example.

Modulator 402 modulates the transition signal provided by transition signal generator 401. Modulator 402 may be a pulse width modulator (PWM) such as a sigma-delta converter, for example. Modulator 402 may convert the transition signal into a bit stream to configure DCO 404 to activate and deactivate the first and second frequencies. The duration of the pulse widths may correspond to time intervals which activate/deactivate the first and second frequencies.

Control signal generator 403 receives the modulated signal from modulator 402 and provides control signals to configure DCO 404 to transition from one frequency to another frequency. Control signal generator 403 may provide a first control word to configure DCO 404 to a first frequency and a second control word to configure DCO 404 to a second frequency. The modulated transition signal may be used to select between the first control word and the second control word during a transition period. The modulated transition signal may provide a smooth transition between the first frequency and the second frequency.

Figure 5:
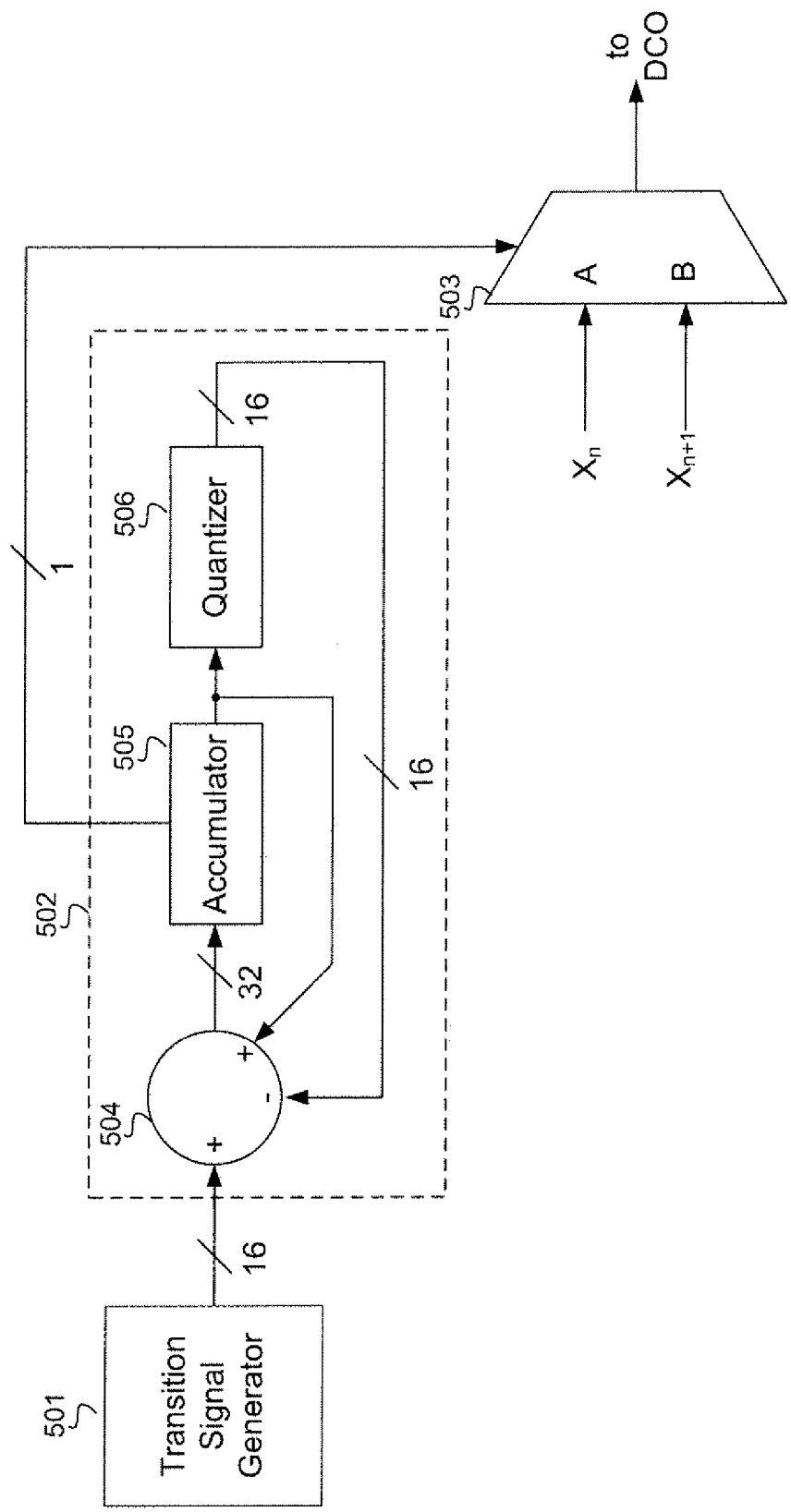
FIG. 5 illustrates an electronic circuit for generating an oscillating signal.

FIG. 5 illustrates an example electronic circuit 500 for generating an oscillating signal. Circuit 500 includes transition signal generator 501, modulator 502, and multiplexer 503. Transition signal generator 501 produces 16 bit words to modulator 502. Modulator 502 is a sigma-delta converter in this embodiment and produces a bit stream from accumulator 502 that successively switches between a first control word and a second control word $X_{n+1}$.

Transition signal generator 501 provides a digital signal. The duration of the transition period may be programmed such that the rate of the transition may be controlled. Modulator 502 modulates the digital signal from transition signal generator 501. Modulator 501 may be a first or higher order sigma-delta converter. A summation node 504 receives the 16 bit transition signal, subtracts the 16 bit output of quantizer 506, and adds the result of accumulator 505. This produces a 32 bit error signal for the input of the accumulator 505. Accumulator 505 functions as a digital integrator to a 32 bit error signal from summation node 504. Accumulator 505 provides an integration of the error signal to quantizer 506. The accumulator 505 provides a sign bit output to multiplexer 503.

Modulator 502 converts the transition signal from transition signal generator 501 into a bit stream. The sign bit of accumulator 505 is a sigma-delta modulated bit stream of the transition signal. Multiplexer 503 may use this bit stream to select between control words associated with the change of frequency.

Multiplexer 503 selects between two control words at input A and input B. Control word $X_n$ may correspond to a signal from DCO having a frequency $f_n$ and control word $X_{n+1}$ may correspond to a signal from DCO having frequency $f_{n+1}$. The modulated signal from modulator 502 provides a pulse width modulated signal corresponding to a smooth transition between frequency $f_n$ and frequency $f_{n+1}$.

Figure 6:
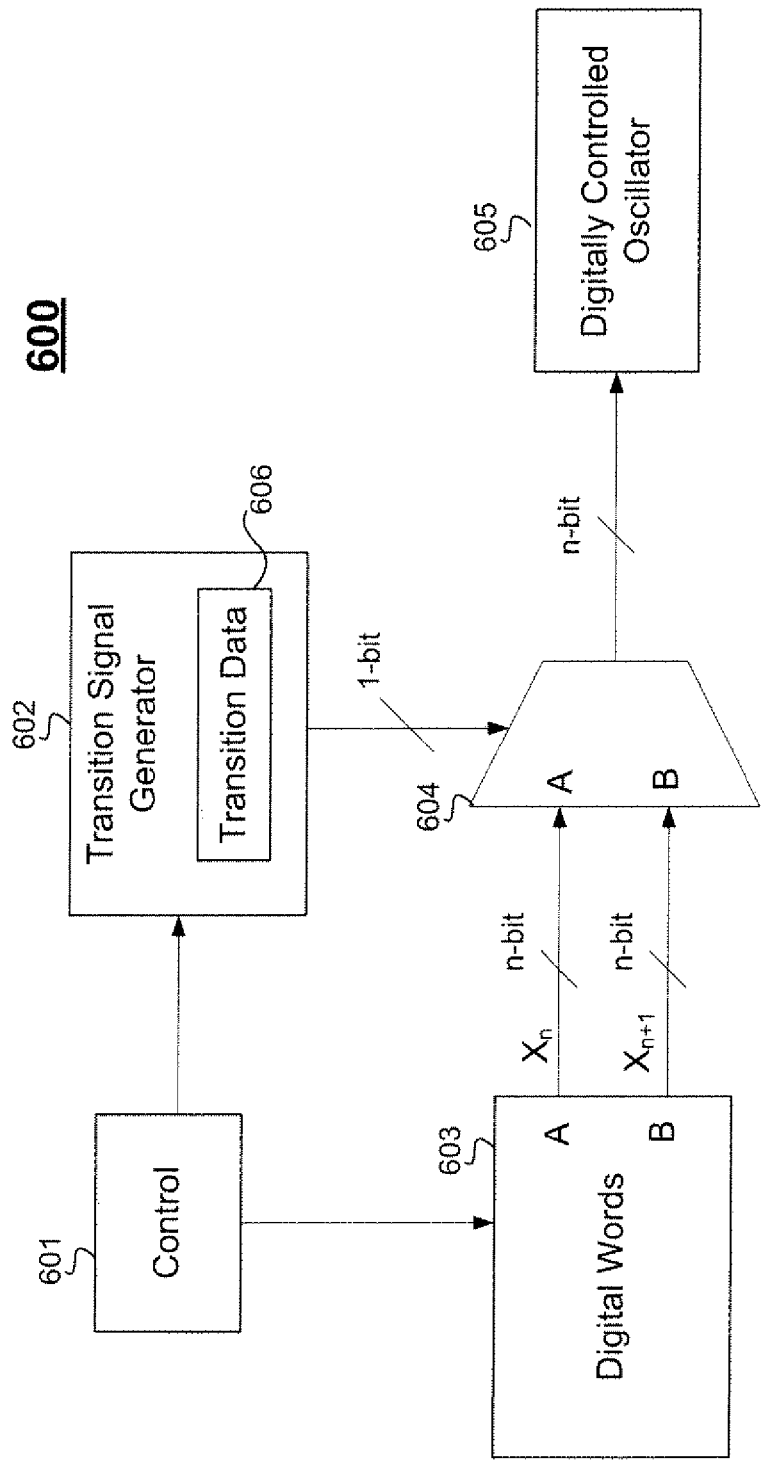
FIG. 6 illustrates an electronic circuit for generating an oscillating signal.

FIG. 6 illustrates an example electronic circuit 600 for generating an oscillating signal. Circuit 600 includes control circuit 601, transition signal generator 602, digital word generator 603, multiplexer 604, and DCO 605. Multiplexer 604 may be similar to multiplexer 503 of FIG. 5. Multiplexer 604 receives digital words from digital word generator 603. These words may be n-bit, which corresponds to the output of multiplexer 604 and the DCO 605 circuitry used. For example, DCO 605 may have "n" switches which are used to configure the desired DCO frequency setting.

In one implementation, transition signal generator 602 generates a bit stream based on transition data 606. The transition data 606 may be predetermined to provide pulse width modulated data corresponding to a minimum frequency change. The transition data may include pulse width modulated data corresponding to an increasing (e.g., A to B) transitional waveform and a pulse width modulated data corresponding to a decreasing (B to A) transitional waveform (as described above). In one implementation, rather than generating the modulated data from a transition signal, the bit stream is stored in memory and provided to the multiplexer 604 when needed for a transition.

Control circuit 601 may determine the succession of digital words provided by digital word generator 603. For example, digital word generator 603 may also be a memory for storing digital words to be coupled to DCO 605 through multiplexer 604 as described above to transition between frequencies. Control circuit 601 may also determine the transition data 606 which may be used to transition between the digital word provided at input A of multiplexer 604 and the digital word provided at input B of multiplexer 604. The transition signal generator 602 uses transition data 606 to provide a bit stream to multiplexer 604.

Multiplexer 604 switches between digital words A and B to provide successive digital words to DCO 605 based on the bit stream provided by transition signal generator 602. A selection between digital word $X_n$ corresponding to frequency $f_n$ and digital word $X_{n+1}$ corresponding to the next successive frequency $f_{n+1}$ may be responsive to the bit stream. Configuring DCO 605 to transition may include transition signal generator 602 generating the bit stream to provide the time intervals corresponding to the activation/deactivation of frequencies $f_{n+1}$ and $f_n$ (as discussed above in regard to FIG. 3B).

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, one or more steps of methods or processes discussed above may be performed in a different order (or concurrently) and still achieve desirable results. Based on the above disclosure and the following claims, other arrangements, embodiments, implementations and equivalents may be employed without departing from the scope of the invention as defined by the claims.

What is claimed is:

1. A method of generating an oscillating signal at different frequencies, the method comprising:
configuring a digitally controlled oscillator (DCO) to generate the oscillating signal at a first frequency, the first frequency being a first discrete frequency adjustment step of the DCO; and
configuring the DCO to transition from the first frequency to a second frequency during a transition time period, the second frequency being a second discrete frequency adjustment step of the DCO and different than the first frequency,
wherein during the transition time period, the DCO transitions from the first frequency to the second frequency by alternately activating the first and the second frequencies during a series of time intervals, and
wherein each of the time intervals includes a first sub-interval of time during which the first frequency is activated and the second frequency is deactivated, a second sub-interval of time during which the second frequency is activated and the first frequency is deactivated, and during each successive time interval of the series the first sub-interval of time progressively decreases and the second sub-interval of time progressively increases.

2. The method of claim 1, wherein the second sub-interval of time is increased based on a linear ramp.

3. The method of claim 1, wherein the first or the second sub-intervals of time are generated in response to a pulse width modulated signal.

4. The method of claim 1, further comprising:
generating a transition signal; and
converting the transition signal into a bit stream to configure the DCO to activate and deactivate the first frequency and the second frequency.

5. The method of claim 4, wherein the transition signal is a digital signal that successively increases from a first value to a second value.

6. The method of claim 4, wherein converting the transition signal into a bit stream comprises processing the transition signal in a sigma-delta modulator.

7. The method of claim 1, wherein configuring the DCO to transition includes generating a bit stream, the bit stream comprising pulse width modulated data corresponding to a transition signal, and wherein a selection between a first code corresponding to the first frequency and a second code corresponding to the second frequency is responsive to the bit stream.

8. An electronic circuit comprising:
a digitally controlled oscillator (DCO) for generating an oscillating signal; and
a transition controller coupled to the DCO, the transition controller to:
configure the DCO to generate the oscillating signal at a first frequency, the first frequency being a first discrete frequency adjustment step of the DCO; and
transition the oscillating signal from the first frequency to a second frequency during a transition time period, the second frequency being a second discrete frequency adjustment step of the DCO and different than the first frequency,
wherein during the transition time period, the DCO transitions from the first frequency to the second frequency by alternately activating the first and the second frequencies during a series of time intervals, and wherein each of the time intervals includes a first sub-interval of time during which the first frequency is activated and the second frequency is deactivated, a second sub-interval of time during which the second frequency is activated and the first frequency is deactivated, and during each successive time interval of the series the first sub-interval of time progressively decreases and the second sub-interval of time progressively increases.

9. The electronic circuit of claim 8, wherein the transition controller includes a digital signal generator to provide a linear ramp to increase the second sub-intervals of time.

10. The electronic circuit of claim 8, wherein the transition controller includes a modulator to provide a pulse width modulated signal,
wherein the first or the second sub-intervals of time are generated in response to the pulse width modulated signal.

11. The electronic circuit of claim 8, wherein the transition controller comprises:
a digital signal generator to provide a transition signal; and
a converter to convert the transition signal into a bit stream to configure the DCO to activate and deactivate the first frequency and the second frequency.

12. The electronic circuit of claim 11, wherein the converter is a sigma delta modulator to convert the transition signal into a bit stream.

13. The electronic circuit of claim 11, wherein the transition signal is a digital signal that successively increases from a first value to a second value.

14. The electronic circuit of claim 8, wherein the transition controller generates a bit stream to configure the DCO to transition, wherein the bit stream comprises pulse width modulated data corresponding to a transition signal, and wherein a selection between a first code corresponding to the first frequency and a second code corresponding to the second frequency is responsive to the bit stream.

15. A communication system comprising:
an amplifier to amplify a radio frequency signal;
a mixer to demodulate the radio frequency signal;
a digitally controlled oscillator (DCO) to provide an oscillating signal to the mixer, and
a transition controller coupled to the DCO, the transition controller to:
configure the DCO to generate the oscillating signal at a first frequency, the first frequency being a first discrete frequency adjustment step of the DCO; and
transition the oscillating signal from the first frequency to a second frequency during a transition time period, the second frequency being a second discrete frequency adjustment step of the DCO and different than the first frequency;
wherein during the transition time period, the DCO transitions from the first frequency to the second frequency by alternately activating the first and the second frequencies during a series of time intervals, and wherein each of the time intervals includes a first sub-interval of time during which the first frequency is activated and the second frequency is deactivated, a second sub-interval of time during which the second frequency is activated and the first frequency is deactivated, and during each successive time interval of the series the first sub-interval of time progressively decreases and the second sub-interval of time progressively increases.

16. The communication system of claim 15, wherein the transition controller includes a digital signal generator to provide a linear ramp to increase the second sub-intervals of time.

17. The communication system of claim 15, wherein the transition controller includes a modulator to provide a pulse width modulated signal and the time intervals are generated in response to the pulse width modulated signal.

18. The communication system of claim 15, wherein the transition controller comprises:
   a digital signal generator to provide a transition signal; and
   a converter to convert the transition signal into a bit stream to configure the DCO to activate and deactivate the first and second frequencies.

19. The communication system of claim 18, wherein the converter is a sigma delta modulator to convert the transition signal into a bit stream.

20. The communication system of claim 18, wherein the transition signal is a digital signal that successively increases from a first value to a second value.

* * * * *